United States Patent

Lindberg

[15] 3,670,396

[45] June 20, 1972

[54] METHOD OF MAKING A CIRCUIT ASSEMBLY

[72] Inventor: Frank A. Lindberg, Linthicum, Md.

[73] Assignee: The United States of America as represented by the Secretary of the Navy

[22] Filed: April 12, 1971

[21] Appl. No.: 132,940

[52] U.S. Cl. ..............................29/471.3, 29/471.1, 29/487, 29/493

[51] Int. Cl. ..........................................................B23k 31/02

[58] Field of Search .................174/DIG. 3; 29/471.1, 471.3, 29/493, 626, 630 G, 589, 487, 628; 113/119

[56] References Cited

UNITED STATES PATENTS

| | | | |
|---|---|---|---|
| 3,312,771 | 4/1967 | Hessinger et al | 29/628 |
| 3,493,820 | 2/1970 | Rosvold | 29/589 X |
| 3,529,759 | 9/1970 | Clark | 29/589 X |
| 3,533,155 | 10/1970 | Coucoulas | 29/471.1 |
| 3,612,955 | 10/1971 | Butherey et al | 29/471.1 X |

*Primary Examiner*—John F. Campbell
*Assistant Examiner*—Richard Bernard Lazarus
*Attorney*—R. S. Sciascia, Henry Hansen and Gilbert H. Hennessey

[57] ABSTRACT

To bond the beam leads of a plurality of integrated circuit chips to a metallization layer on a transparent compliant film, the chips are first registered in matching etched holes on a flat ground steel block. The flat beam leads lie on the surface of the block and support the chips. The film is arranged on top of the etched block with its metallization pattern in alignment with the corresponding beam leads. At room temperature the film is pressed downwardly on top of the exposed beam leads by an opposing flat ground block. Heat is then applied for bonding, and pressure is maintained until the assembly cools to prevent misregistration.

6 Claims, 6 Drawing Figures

INVENTOR.
FRANK A. LINDBERG
BY
ATTORNEYS

INVENTOR.
FRANK A. LINDBERG
BY [signature]
ATTORNEYS

METHOD OF MAKING A CIRCUIT ASSEMBLY

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The invention relates generally to the field of microelectronic circuit assembly, and more particularly, to improved methods for mounting discrete electronic components on a circuit board.

Various types of integrated circuit modules employing medium scale integration have become commercially available. Chips or flat packs are ordinarily flat rectangular components containing a miniaturized circuit such as a buffer amplifier. Beam lead chips have a plurality of flat coplanar metallic leads (frequently gold) extending outwardly from one surface of the chip. In attaching such chips to a printed circuit board, the beam leads are aligned with the corresponding terminals in the printed circuit pattern and bonded in place to form an electrical and mechanical connection.

In the past a single headed tool called a collet has been used for bonding beam lead chips one at a time to circuit boards. The previous assembly had a rectangular collar and vacuum chuck which allowed a single chip to be picket up, registered on the circuit board and bonded by the simultaneous application of heat and pressure to the corresponding circuit board terminals. Thermocompression bonding is a type of diffusion bonding in which two metals are placed in intimate contact and pressed together while heat below the melting point of either metal is continuously applied. In the bonding operation crystals of the two metals become embedded in each other although neither metal is truly melted as in a typical welding operation.

The prior art single chip method had many disadvantages. First it was a complex, relatively slow operation where numerous beam lead chips were to be bonded to a single circuit board. Proper registration required the use of a complicated optical system for aligning the beam leads with the circuit paths. Second because only one area of the circuit board was affected while bonding a single chip, differential compression and thermal expansion fre-quently caused defects in previous bonds on the same circuit board.

SUMMARY OF THE INVENTION

Accordingly, the general purpose of the invention is to bond simultaneously a plurality of beam lead chips to a circuit board. Another object of the invention is to overcome the problem of differential expansion of circuit boards under local heating. A further object of the invention is to utilize a compliant transparent film as a mounting base for beam lead chips.

These and other objects are achieved by forming rectangular holes in a flat ground steel block corresponding to the size and precise location of beam lead chips on a circuit pattern. The chips are first placed in registration in the corresponding holes so that the flat beam leads lie on the surface of the block and support the chips. A circuit pattern is formed by a metallization layer on a transparent compliant film, and the film is placed face down on top of the beam lead devices in registration therewith. At room temperature the film is pressed downwardly on top of the exposed beam leads by an opposing flat surface. Heat is then applied for diffusion bonding, and pressure is maintained until the assembly cools to prevent thermal misregistration.

DESCRIPTION OF THE PREFERRED EMBODIMENT

Figures 1, 2:
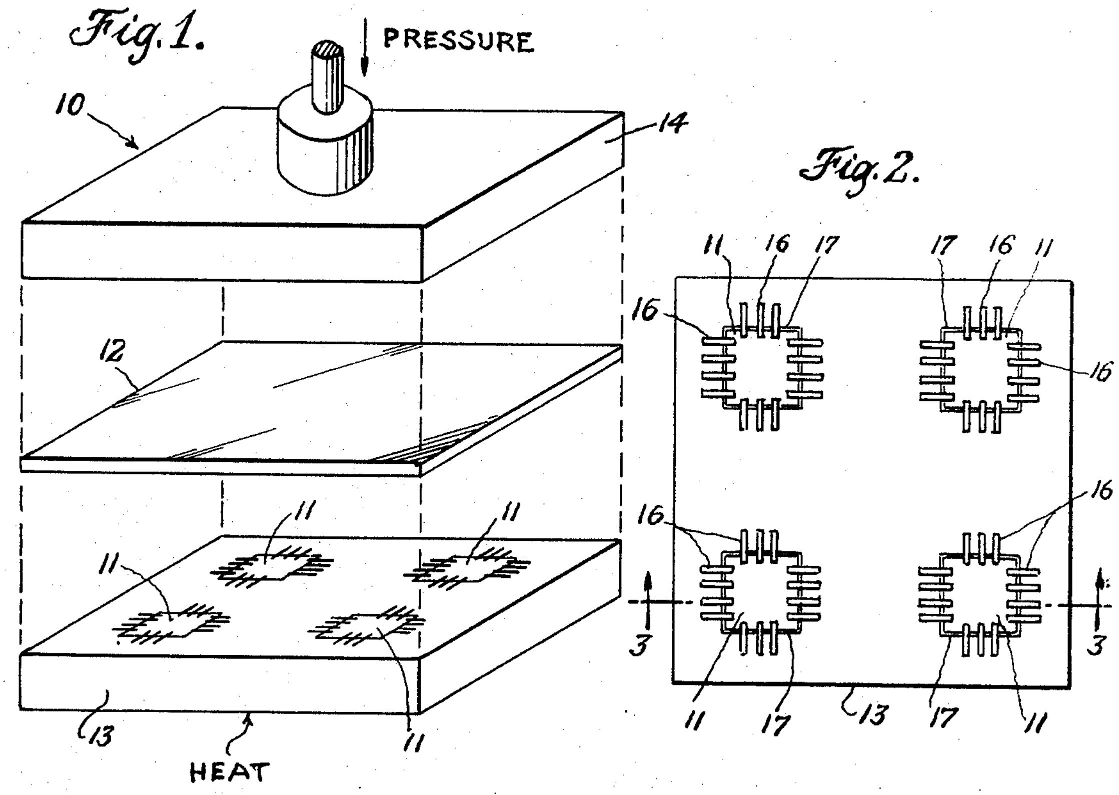
FIG. 1 is an isometric view of thermocompression bonding apparatus used in carrying out the method of the invention.
FIG. 2 is a plan view of the lower block of FIG. 1.
Figure 3:
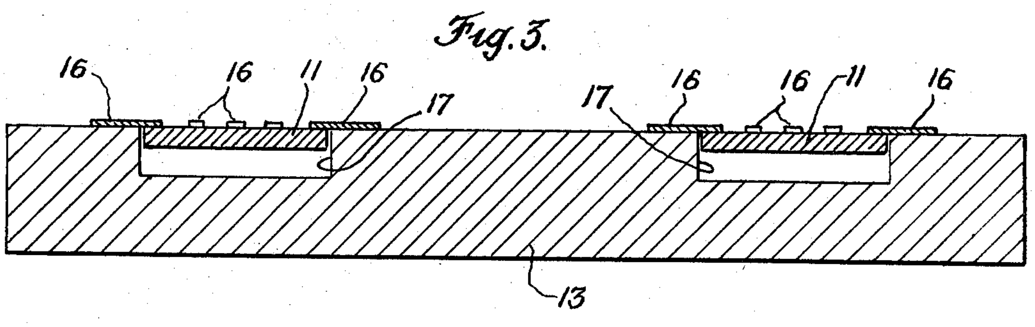
FIG. 3 is a cross-sectional view of the lower block taken along lines 3—3 in the direction of the arrows in FIG. 2.

Referring to FIG. 1, thermocompression bonding apparatus is shown generally at 10 comprising lower and upper steel blocks 13 and 14 having flat ground, opposing parallel faces. Lower block 13 has rectangular holes 17 (FIG. 2) formed to carry beam lead chips 11 in its face. The size of holes 17 should correspond precisely to the size of the individual chips used and typically provide one-half mil clearance around the outside of the chips. The physical size of a single beam lead is typically 0.008 inches long, 0.003 inches wide and 0.0005 inches thick. Half of the beam lead is ordinarily attached to the surface of the chip with the other half extending over the edge of the chip. As in FIG. 3 the chips are first placed upside down in holes 17 with their beam leads 16 resting on the adjacent surface of block 13. There is no critical depth for holes 17. However, the walls of holes 17 must be relatively straight. To form holes 17 etching techniques are suitable only for shallow depths due to rounding of edges. Electric discharge machining can be used to produce rectangular holes beyond depths of 5 mils.

Figure 4:
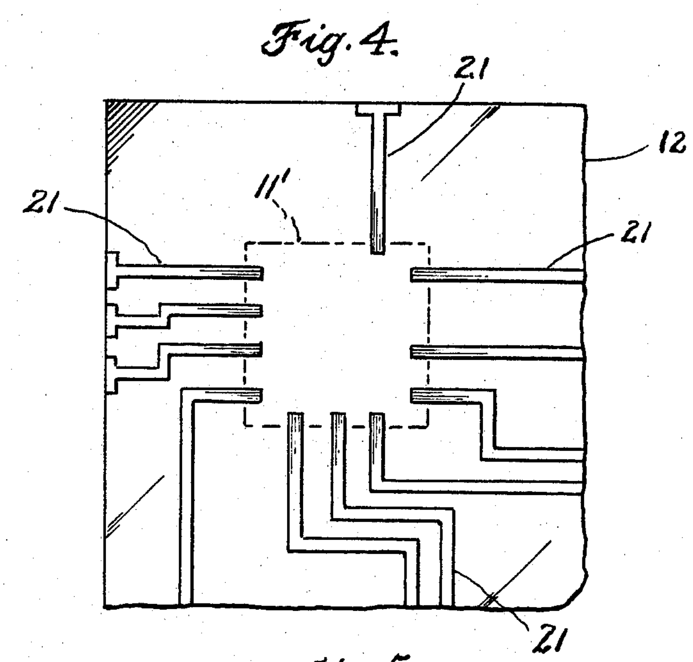
FIG. 4 is a fragmentary plan view of the film of FIG. 1 bearing a circuit pattern prior to chip bonding.

Referring to FIG. 4, chips 11 are to be bonded to a transparent compliant substrate 12 having a pattern of conductive leads 21 disposed on one side, the underneath side in FIG. 1. Compliant substrate 12 is preferably a polyimide or amide-imide flexible dielectric film of approximately 1 mil thickness. Polypyromellitimide plastic known as H-film has been found satisfactory and is preferred because of its etchable and high temperature characteristics. The conductive pattern 21 is preferably vapor deposited aluminum which has been etched using a photo resist in the conventional manner. Aluminum is preferred since its thermal expansion coefficient matches that of H-film. The thickness of paths 21 is ordinarily from 0.0001 to 0.0002 inch.

Figure 5:
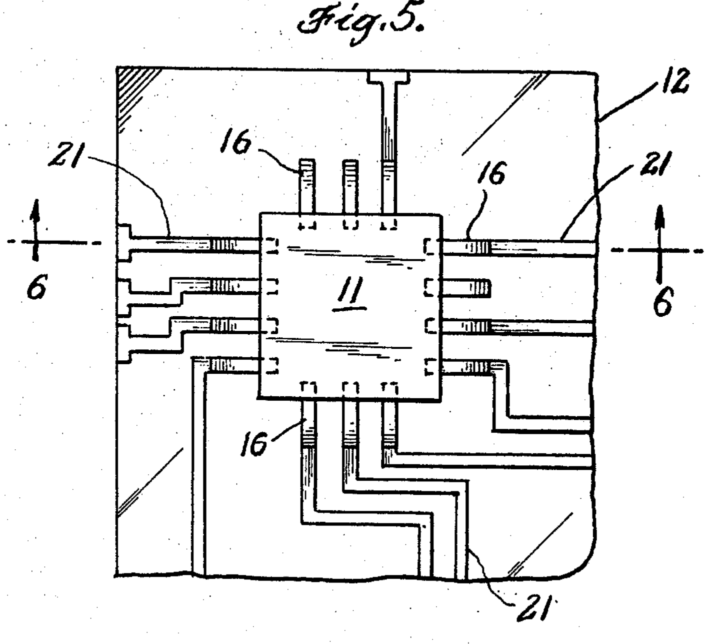
FIG. 5 is another fragmentary plan view of the film of FIG. 1 after chip bonding.
Figure 6:
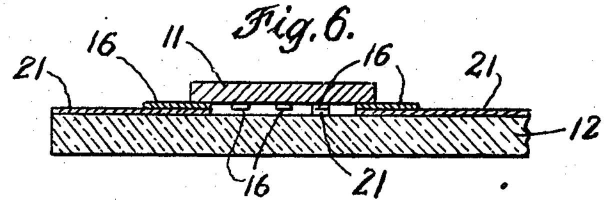
FIG. 6 is a cross-sectional view of the film along lines 6—6 in the direction of the arrows in FIG. 5.

A portion of the completed assembly is shown in FIGS. 5 and 6. A typical chip 11 has its beam leads 16 diffusion bonded to corresponding conductive paths 21.

In carrying out the bonding process the following steps are observed:

1. As a first preliminary step transparent compliant film 12 must be prepared with an etched pattern of metallic conductors 21.

2. As a second preliminary step rectangular holes 17 corresponding to the size of the body portions of chips 11 must be formed in block 13 at locations and orientations relating to the appropriate conductive pattern terminals on film 12.

3. Chips 11 are placed upside down, i.e., face up, in respective holes 17 in block 13. If the body of the chip is capable of insertion into holes 17 in different orientations, the proper orientation to match the conductive pattern on film 12 must be chosen.

4. Film 12 is superimposed on top of block 13 with chips 11 in place so that the conductive paths on the adjacent side of film 12 are in exact alignment with the corresponding beam leads 16. This may be accomplished visually due to the transparency of film 12.

5. Flat block 14 is brought down on top of film 12 to apply pressure to the entire surface. Since the film is compliant, a compressive stress is placed on each beam lead and its counterpart conductive path on the film, thus accommodating for any nonuniformity in the thickness of the beam leads 16 or conductive paths 21. Typically the pressure applied to the assembly is about 12,500 pounds per square inch.

6. After the pressure has been initiated, heat is applied through block 13 to form the diffusion bond between beam leads 16 and conductive paths 21. A typical heat range would be 200° to 250° Centigrade for a bond between gold beam leads and aluminum paths, well below the melting point of either metal. Heat and pressure are applied for several seconds, typically 10 to 15 seconds. Less time would, of course, be required with greater pressure and heat values.

7. Pressure is maintained by block 14 until the assembly has cooled to room temperature.

8. As soon as pressure is released the completed assembly with chips 11 electrically and mechanically bonded to film 12 may be removed from block 13.

Ordinarily the compliant, flexible nature of the film would be a handicap in chip bonding. With prior art single chip methods the local deformation of the film when bonding one chip often disturbed the bonds of chips previously bonded on the same film. In addition, unimpeded local thermal expansion could break nearby bonds. The multiple headed chip bonding tool of FIG. 1 overcomes this problem and takes advantage of the formerly troublesome characteristics of the film in bonding the chips. Since compressive stress is placed over all areas of the film during bonding, no differential compression problem exists. Moreover since the film is compressed before it is heated no differential expansion can take place. When heat is applied no misregistration occurs since the expansion of the film cannot generate enough stress to shear any of the bonds due to its low modulus of elasticity. Therefore, when blocks 13 and 14 are separated and the film removed, the conductor patterns will have the same registration they originally had at room temperature. Block 13 thus serves several functions in the bonding process: It holds chips 11 in proper registration, it serves as a bonding tool, and it is in contact with film 12 over its entire surface so that the film will not differentially expand during the heating process. Due to its compliant nature, the film deforms around the beam leads to provide a uniform pressure at the metal interface assuring uniformity in the quality of the bonds for all beam leads on the chip.

By using the chip bonding method of the invention, the operation of bonding a number of chips to a substrate is vastly simplified meeting the future requirements for mass production of microelectronic circuits employing beam lead chips. Alignment of chips and conductive patterns is accomplished without the use of complicated optical systems due to the film's transparency and the orientation of the film on top of the beam leads. Moreover the bonding apparatus needs no vacuum chuck devices since gravity holds all of the chips in place. Fabrication of block 13 by etching or electric discharge machining is a simple low cost procedure permitting maximum flexibility in accommodating various chip sizes and patterns.

It will be understood that various changes in the details, materials, steps and arrangements of parts, which have been herein described and illustrated in order to explain the nature of the invention, may be made by those skilled in the art within the principle and scope of the invention as expressed in the appended claims.

What is claimed is:

1. A method of attaching coplanar beam lead microelectronic components to a substrate, comprising the steps of placing a plurality of said components in respective holes formed in a flat surface such that the beam leads are supported by adjacent portions of said surface while the bodies of said components are suspended in said holes flush with said adjacent surface and are supported solely by said beam leads;

superimposing on said components a substrate having one side furnished with a conductive circuit pattern in alignment with said beam leads;

applying uniform pressure to an other side of said substrate;

subsequently heating said substrate and said beam leads while continuing said pressure to form a diffusion bond between said beam leads and corresponding portions of said conductive pattern;

discontinuing said heating; and maintaining said pressure during cooling to prevent thermal expansion.

2. A method according to claim 1 wherein:
said substrate is a transparent film.

3. A method according to claim 2 further comprising the step of:

visually aligning said substrate circuit pattern with said beam leads before applying said uniform pressure.

4. A method according to claim 2 wherein:
said transparent film is compliant.

5. A method according to claim 4 wherein:
said transparent compliant film is a polymer film.

6. A method according to claim 5 wherein:
said transparent compliant polymer film is polypyromellitimide plastic.

* * * * *